US008117523B2

(12) United States Patent
Divsalar et al.

(10) Patent No.: US 8,117,523 B2
(45) Date of Patent: Feb. 14, 2012

(54) RATE-COMPATIBLE PROTOGRAPH LDPC CODE FAMILIES WITH LINEAR MINIMUM DISTANCE

(75) Inventors: Dariush Divsalar, Pacific Palisades, CA (US); Samuel J Dolinar, Jr., Sunland, CA (US); Christopher R. Jones, Pacific Palisades, CA (US)

(73) Assignee: California Institute of Technology, Pasadena, CA (US)

( * ) Notice: Subject to any disclaimer, the term of this patent is extended or adjusted under 35 U.S.C. 154(b) by 813 days.

(21) Appl. No.: 12/125,862

(22) Filed: May 22, 2008

(65) Prior Publication Data

US 2008/0294969 A1    Nov. 27, 2008

Related U.S. Application Data

(60) Provisional application No. 60/931,442, filed on May 23, 2007.

(51) Int. Cl.
*H03M 13/13*  (2006.01)
*H03M 13/00*  (2006.01)
(52) U.S. Cl. ......... 714/801; 714/751; 714/752; 714/758
(58) Field of Classification Search .................. 714/751, 714/752, 758, 801
See application file for complete search history.

(56) References Cited

U.S. PATENT DOCUMENTS

| | | | |
|---|---|---|---|
| 3,542,756 A | 11/1970 | Gallager | |
| 3,655,396 A | 4/1972 | Goto et al. | |
| 4,295,218 A | 10/1981 | Tanner | |
| 5,023,889 A | 6/1991 | Divsalar et al. | |
| 5,729,560 A | 3/1998 | Hagenauer et al. | |
| 5,734,962 A | 3/1998 | Hladik et al. | |
| 6,014,411 A | 1/2000 | Wang | |
| 6,023,783 A | 2/2000 | Divsalar et al. | |
| 6,473,010 B1 | 10/2002 | Vityaev et al. | |
| 6,518,892 B2 | 2/2003 | Shen et al. | |
| 6,539,367 B1 | 3/2003 | Blanksby et al. | |
| 6,560,362 B1 | 5/2003 | Piret et al. | |
| 6,567,465 B2 | 5/2003 | Goldstein et al. | |

(Continued)

OTHER PUBLICATIONS

D. Divsalar, C. Jones, S. Dolinar, J. Thorpe; "Protograph Based LDPC Codes with Minimum Distance Linearly Growing with Block Size ," IEEE Globecom 2005.

(Continued)

*Primary Examiner* — Scott Baderman
*Assistant Examiner* — Justin R Knapp
(74) *Attorney, Agent, or Firm* — Steinfl & Bruno LLP

(57) ABSTRACT

Digital communication coding methods are shown, which generate certain types of low-density parity-check (LDPC) codes built from protographs. A first method creates protographs having the linear minimum distance property and comprising at least one variable node with degree less than 3. A second method creates families of protographs of different rates, all having the linear minimum distance property, and structurally identical for all rates except for a rate-dependent designation of certain variable nodes as transmitted or non-transmitted. A third method creates families of protographs of different rates, all having the linear minimum distance property, and structurally identical for all rates except for a rate-dependent designation of the status of certain variable nodes as non-transmitted or set to zero. LDPC codes built from the protographs created by these methods can simultaneously have low error floors and low iterative decoding thresholds, and families of such codes of different rates can be decoded efficiently using a common decoding architecture.

6 Claims, 14 Drawing Sheets

U.S. PATENT DOCUMENTS

| | | | |
|---|---|---|---|
| 6,633,856 | B2 | 10/2003 | Richardson et al. |
| 6,686,853 | B2 | 2/2004 | Shen et al. |
| 6,715,121 | B1 | 3/2004 | Laurent |
| 6,718,502 | B1 | 4/2004 | Kuznetsov et al. |
| 6,724,327 | B1 | 4/2004 | Pope et al. |
| 6,757,122 | B1 | 6/2004 | Kuznetsov et al. |
| 6,769,091 | B2 | 7/2004 | Classon et al. |
| 6,771,197 | B1 | 8/2004 | Yedidia et al. |
| 6,785,863 | B2 | 8/2004 | Blankenship et al. |
| 6,789,227 | B2 | 9/2004 | De Souza et al. |
| 6,803,787 | B1 | 10/2004 | Wicker, Jr. |
| 6,829,308 | B2 | 12/2004 | Eroz et al. |
| 6,842,872 | B2 | 1/2005 | Yedida et al. |
| 6,848,069 | B1 | 1/2005 | Levy et al. |
| 6,857,097 | B2 | 2/2005 | Yedidia et al. |
| 6,862,552 | B2 | 3/2005 | Goldstein et al. |
| 6,888,897 | B1 | 5/2005 | Nazari et al. |
| 6,903,665 | B2 | 6/2005 | Akhter et al. |
| 7,089,477 | B1 | 8/2006 | Divsalar et al. |
| 7,093,179 | B2 | 8/2006 | Shea |
| 7,095,792 | B2 | 8/2006 | Doetsch et al. |
| 7,158,589 | B2 | 1/2007 | Cameron et al. |
| 7,191,376 | B2 | 3/2007 | Yedidia |
| 7,243,294 | B1 | 7/2007 | Divsalar et al. |
| 7,313,752 | B2 | 12/2007 | Kyung et al. |
| 7,343,539 | B2 | 3/2008 | Divsalar et al. |
| 2005/0149845 | A1 | 7/2005 | Shin et al. |
| 2005/0223305 | A1 | 10/2005 | Kons |
| 2007/0011568 | A1 | 1/2007 | Hocevar |
| 2007/0162815 | A1* | 7/2007 | El-Khamy et al. ............ 714/752 |
| 2007/0283216 | A1* | 12/2007 | Kyung et al. ................. 714/758 |
| 2008/0059862 | A1* | 3/2008 | Kyung et al. ................. 714/752 |
| 2008/0222486 | A1* | 9/2008 | Richardson et al. .......... 714/757 |
| 2010/0023834 | A1* | 1/2010 | Richardson et al. .......... 714/751 |

OTHER PUBLICATIONS

D. Divsalar, "Ensemble Weight Enumerators for Protograph LDPC Codes," *2006 IEEE International Symposium on Information Theory*, Jul. 2006 pp. 1554-1558.

A. Vila Casado, W. Weng, R.-D. Wesel, "Multiple rate low-density parity-check codes with constant blocklength," Proceedings, 38th Asilomar Conference, 2004. Nov. 7-10, 2004 pp. 2010-2014.

D. Divsalar, S. Dolinar, C. Jones, "Construction of Protograph Codes with Linear Minimum Distance," IEEE ISIT 2006, Seattle, Washington, Jul. 9-14, 2006.

D. Divsalar, C. Jones, "Protograph LDPC Codes with Node Degrees at Least 3," 2006 IEEE Global Telecommunications Conference, Nov. 27-Dec. 1, 2006, San Francisco, California, USA.

Yu Kou et al., "On Circulant Low Density Parity Check Codes", IEEE International Symposium on Information Theory, Jun. 30-Jul. 5, 2002, p. 200.

S. Lin, "Quasi-Cyclic LDPC Codes" CCSDS working group white paper, Oct. 2003.

R.M. Tanner, "On Graph Constructions for LDPC Codes by Quasi-Cyclic Extension," in Information, Coding and Mathematics (M. Blaum, P. Farrell, and H. van Tilborg, eds.) pp. 209-220, Kluwer, Jun. 2002.

A Sridharan, et al., "A Construction for Low Density Parity Check Convolutional Codes Based on Quasi-Cyclic Block Codes", in IEEE International Symposium on Information Theory p. 481, Jun. 30-Jul. 5, 2002.

J. Thorpe et al. "Methodologies for Designing LDPC Codes Using Photographs and Circulants," in IEEE International Symposium on Information Theory, p. 238, Jun. 27-Jul. 2, 2004.

Aliazam Abbasfar et al. "Accumulate Repeat Accumulate Coded Modulation" IEEE Military Communications Coference, Oct. 31-Nov. 3, 2004.

Aliazam Abbasfar et al. "Accumulate Repeat Accumulate Codes" IEEE Globecom 2004, Nov. 29-Dec. 3, 2004.

Aliazam Abbasfar et al., "Maximum Likelihood Decoding Analysis of Accumulate-repeat-Accumulate Codes" IEEE Globeconn 2004, Nov. 29-Dec. 3, 2004.

R.G. Gallager, Low Density Parity Check Codes. Cambridge, MA: MIT Press, 1963.

Berrou and A. Glavieux, "Near optimum error correcting coding and decoding: Turbo-codes," IEEE Trans. Commun., vol. 44, pp. 1261-1271, Oct. 1996.

M.R. Tanner, "A recursive approach to low complexity codes," IEEE Trans. Inform. Theory, vol. 27, pp. 533-547, 1981.

T. Richardson, A. Shokrollahi, and R. Urbanke, "Design of capacity-approaching irregular low-density parity-check codes," IEEE Trans. Informa. Theory, vol. 47, pp. 619-637, 2001.

Divsalar, H. Jin, and R. McEliece, "Coding theorems for Turbo-like codes," in Proceedings of the 1998 Allerton Conference, 1998.

H. Jin, A. Khandekar and R. McEliece, "Irregular repeat-accumulate codes," in Proc. $2^{nd}$ International Symposium on Turbo Codes, 2000.

Jeremy Thorpe, "Low Density Parity Check (LDPC) Codes Constructed from Protographs," JPL INP Progress Report 42-154, Aug. 15, 2003.

T. Richardson, "Multi-Edge type LDPC Codes," presented at the Workshop honoring Prof. Bob McEliece on his $60^{th}$ birthday, California Institute of Technology, Pasadena, California, May 24-25, 2002.

D.J.C. Mackay, R.M. Neal, "Near Shannon limit performance of low density parity check codes," Electronics Letters, vol. 32, Issue 18, 29 Aug. 1996, p. 1645.

T. Richardson and R. Urbanke, 'The Renaissance of Gallager's Low-Density Parity-Check Codes, IEEE Communications Magazine, pp. 126-131, Aug. 2003.

M. Luby, M. Mitzenmacher, A. Shokrollahi, and D. Spielman, "Improved Low-Density Parity-Check Codes Using Irregular Graphs," IEEE Trans. Inform. Theory, vol. 47, pp. 585-598, 2001.

T. Richardson and R. Urbanke, 'The capacity of low-density parity check codes under message-passing decoding, IEEE Trans. Inform. Theory, vol. 47, pp. 599-618, 2001.

F.R. Kschischang, "Codes defined on graphs," IEEE Communications Magazine, vol. 41, Issue 8, Aug. 2003, pp. 118-125.

S.L. Fogal, Robert McEliece, Jeremy Thorpe "Enumerators for Protograph Ensembles of LDPC Codes," IEEE ISIT 2005, Adelaide, Australia Sep. 4-9, 2005.

D. Divsalar, "Ensemble Weight Enumerators for Protograph LDPC Codes," Proceedings, 2006 IEEE International Symposium on Information Theory, Jul. 9-14, 2006 pp. 1554-1558.

Changyan Di; Urbanke, R.; Richardson, T.; "Weight distributions: how deviant can you be?" Proceedings, 2001 IEEE International Symposium on Information Theory, 2001. Jun. 24-29, 2011 p. 50.

Tian, T.; Jones, C.; Villasenor, J.; and Wesel, R.D.; "Characterization and selective avoidance of cycles in irregular Ldpc code construction," IEEE Transactions on Communications, Aug. 2004, pp. 1242-1247.

Chung S.Y., "On the Construction of Some Capacity-Approaching Coding Schemes," Ph.D. dissertation, Massachusetts Institute of Technology, Cambridge, Massachusetts, Sep., 2000.

Xiao-Yu Hu; Eleftheriou, E.; Arnold, D.-M.; "Progressive edge-growth Tanner graphs," Global Telecommunications Conference, 2001. Globecome '01. IEEE vol. 2, Nov. 25-29, 2001 pp. 995-1001 vol. 2.

D. Divsalar, S. Donlinar, J. Thorpe, C. Jones, "Constructing LDPC Codes from Simple Loop-Free Encoding Modules," International Conference on Communications (ICC) 2005. Seoul, Korea.

\* cited by examiner r=1/2  threshold = 0.618 dB

| Code rate | Node 8 | Node 9 | Node 10 |
|---|---|---|---|
| 1/2 | 0 | 0 | 0 |
| 5/8 | X | 0 | 0 |
| 3/4 | X | X | 0 |
| 7/8 | X | X | X |

FIG. 7

| Code Rate | Protograph Threshold | Capacity | Difference |
|---|---|---|---|
| 1/2 | 0.628 | 0.187 | 0.441 |
| 2/3 | 1.450 | 1.059 | 0.391 |
| 3/4 | 2.005 | 1.626 | 0.379 |
| 4/5 | 2.413 | 2.040 | 0.373 |
| 5/6 | 2.733 | 2.362 | 0.371 |
| 6/7 | 2.993 | 2.625 | 0.368 |
| 7/8 | 3.209 | 2.845 | 0.364 | rate 1/2   threshold = 0.544 dB

US 8,117,523 B2

RATE-COMPATIBLE PROTOGRAPH LDPC CODE FAMILIES WITH LINEAR MINIMUM DISTANCE

CROSS REFERENCE TO RELATED APPLICATIONS

The present application claims priority to U.S. Provisional 60/931,442 filed on May 23, 2007, which is incorporated herein by reference in its entirety. The present application is also related to U.S. Pat. No. 7,343,539 for "ARA Type Protograph Codes", issued on Mar. 11, 2008, also incorporated herein by reference in its entirety.

STATEMENT OF GOVERNMENT GRANT

The invention described herein was made in the performance of work under a NASA contract, and is subject to the provisions of Public Law 96-517 (35 USC 202) in which the Contractor has elected to retain title.

FIELD

The present disclosure relates to constructing low-density parity-check (LDPC) codes from small template graphs called protographs. More in particular, it relates to new methods for designing rate-compatible families of protographs of different rates, all having the linear minimum distance property, as well as a new method for constructing individual protographs having one or more degree-2 variable node yet guaranteed to possess the linear minimum distance property. LDPC codes of arbitrarily large size can be built by known methods expanding from these individual protographs or rate-compatible protograph families.

SUMMARY

According to a first aspect, a digital communication coding method is provided, comprising: providing a low-density parity-check (LDPC) code represented by a protograph, the protograph being provided with a linear minimum distance property, the protograph comprising at least one variable node with degree less than 3, and the protograph obtained by applying one or more operations in succession starting with a base protograph having all variable node degrees at least 3, each said one or more operations comprising a splitting of one check node of the base protograph or subsequent protographs into two check nodes and connecting said two check nodes with a transmitted degree-2 variable node.

According to a second aspect, a digital communication coding method is provided, comprising: providing a family of low-density parity-check (LDPC) codes of different rates but constant input block size, said family represented by a set of protographs of different rates, said protographs being provided with a linear minimum distance property, and said protographs obtained by applying one or more operations in succession starting with a base protograph having all variable node degrees at least 3, each said one or more operations comprising a splitting of one check node of the base protograph or subsequent protographs into two check nodes and connecting said two check nodes with either a transmitted degree-2 variable node or a non-transmitted degree-2 variable node.

According to a third aspect, a digital communication coding method is provided, comprising: providing a family of low-density parity-check (LDPC) codes of different rates but constant output block size, said family represented by a set of protographs of different rates, said protographs being provided with a linear minimum distance property, and said protographs obtained by applying one or more operations in succession starting with a base protograph having all variable node degrees at least 3, each said one or more operations comprising a connecting of two check nodes of the base protograph or subsequent protographs with either a non-transmitted degree-2 variable node or a non-transmitted degree-2 variable node set to zero.

Further aspects of the present disclosure are described in the written specification, drawings and claims of the present application.

DEFINITIONS

As known to the person skilled in the art and as also mentioned in U.S. Pat. No. 7,343,539 incorporated herein by reference in its entirety, a low-density parity-check (LDPC) code is a linear code determined by a sparse parity-check matrix H having a small number of 1s per column. The code's parity-check matrix H can be represented by a bipartite Tanner graph wherein each column of H is represented by a transmitted variable node, each row by a check node, and each "1" in H by a graph edge connecting the variable node and check node that correspond to the column-row location of the "1". The code's Tanner graph may additionally have non-transmitted variable nodes or state variables, which do not correspond to columns of the parity-check matrix but which can simplify the graphical representations of some codes. Each check or constraint node defines a parity check operation. Moreover, the fraction of a transmission that bears information is called the rate of the code. An LDPC code can be encoded by deriving an appropriate generator matrix G from its parity-check matrix H. An LDPC code can be decoded efficiently using a well-known iterative algorithm that passes messages along edges of the code's Tanner graph from variable nodes to check nodes and vice-versa until convergence is obtained.

A protograph is a small bipartite template graph containing variable nodes joined by edges to check nodes. Arbitrarily large LDPC codes can be constructed from any given protograph by first making an arbitrary number of copies of the protograph and then permuting the endpoints of the set of copies of a given edge among the set of copies of the variable or check nodes at the endpoints of that edge in the protograph. This procedure of expanding a protograph to create a large LDPC code can be performed in various ways. One method assigns a permutation, circulant, or circulant permutation of size N to each edge of the protograph. If the protograph has n transmitted variable nodes, then the derived graph for the expanded LDPC code has nN transmitted variable nodes. Another method is useful when the protograph has parallel edges, which are two or more edges connecting the same pair of variable and check nodes. One can first use the copy and permute operation to expand the protograph by a factor of $N_1$, to obtain a larger protograph without parallel edges. Then this method assigns a permutation, circulant, or circulant permutation of size $N_2$ to each edge of the larger protograph as expanded from the original protograph. The derived graph now has $nN_1N_2$ transmitted variable nodes if the original protograph had n transmitted variable nodes.

The rate of a protograph is defined to be the lowest (and typical) rate of any LDPC code constructed from that protograph. All LDPC codes constructed from a given protograph have the same rate except for possible check constraint degeneracies, which can increase (but never decrease) this rate and typically occur only for very small codes. Since the protograph serves as a blueprint for the Tanner graph representing any LDPC code expandable from that protograph, it also serves as a blueprint for the routing of messages in the iterative algorithm used to decode such expanded codes.

Excluding check nodes connected to degree-1 variable nodes, applicants have proved that the number of degree-2 nodes should be at most one less than the number of check nodes for a protograph to have the linear minimum distance property. A given protograph is said to have the linear minimum distance property if the typical minimum distance of a random ensemble of arbitrarily large LDPC codes built from that protograph grows linearly with the size of the code, with linearity coefficient $\delta_{min} > 0$.

The iterative decoding threshold of a given protograph is similarly defined with respect to this random ensemble of LDPC codes as the lowest value of signal-to-noise ratio for which an LDPC decoder's iterative decoding algorithm will find the correct codeword with probability approaching one as the size of an LDPC code built from that protograph is made arbitrarily large. Iterative decoding thresholds can be calculated by using the reciprocal channel approximation. Thresholds can be lowered either by using preceding or through the use of one very high-degree node in the base protograph. A protograph is said to have a low iterative decoding threshold if its threshold is close to the capacity limit for its rate.

A family of protographs of different rates is said to be rate-compatible if the protographs for different rates are sufficiently similar to each other in structure that a decoder for an entire family of LDPC codes of different rates built from these protographs can be implemented much more simply than separate decoders for each rate. The rate-compatible families described in the present disclosure are rate-compatible to the maximum extent, in the sense that the protographs for all rates have the identical number of variable and check nodes and identical connections between variable and check nodes, with the only differences between protographs of different rates being a trivial designation of the status (transmitted, non-transmitted, or set to zero) of some of the variable nodes.

The protograph-based LDPC codes according to the present disclosure simultaneously achieve low iterative decoding thresholds, linear minimum distance, and can provide various code rates. In addition the proposed codes may have either fixed input block or fixed output block sizing and in both cases provide rate compatibility. In fact, one encoder and one decoder can support different code rates. Several families are described where each includes high- to low-rate codes and each has minimum distance linearly increasing in block size with capacity-approaching performance thresholds.

As will be described, the linear minimum distance property was verified by considering ensemble average weight enumerators wherein the minimum distance of the proposed codes was shown to grow linearly with block size.

BRIEF DESCRIPTION OF THE DRAWINGS

FIG. 7 shows a table that specifies different combinations of status (set to zero or not) of the three non-transmitted variable nodes in FIG. 6, that allow the single protograph structure in FIG. 6 to represent protographs of rates ½, ⅝, ¾, and ⅞.

DETAILED DESCRIPTION

The codes constructed in accordance with the methods described in the present disclosure can fall into four categories. Each can find application in different scenarios. These four categories are: (1) LDPC codes built from individual protographs having the linear minimum distance property and having one or more variable nodes of degree-2; (2) Rate-compatible families of LDPC codes with fixed input block size built from a family of protographs of different rates all having the linear minimum distance property, with protographs for all rates identical in structure except for the transmit status of degree-2 variable nodes; (3) Rate-compatible families of LDPC codes with fixed output block size built from a family of protographs of different rates all having the linear minimum distance property, with protographs for all rates identical in structure except for the status of degree-2 variable nodes; (4) LDPC codes built from individual protographs having the linear minimum distance property and low iterative decoding threshold close to the capacity limits for their respective rates.

1. Protographs Having the Linear Minimum Distance Property and Having One or More Variable Nodes of Degree-2.

In most wireless standards, either a convolutional or turbo code with puncturing for various code rates is included. The proposed LDPC codes with the linear minimum distance property have very low error floor, can produce various code rates, and a single fast decoder using belief propagation can be implemented to handle the different code rates. Thus these LDPC codes have all the required practical features, and they achieve excellent performance, and very low error floor even for short blocks. Low error floors are necessary in applications where re-transmission is either impossible, for instance when broadcasting video from one point to many, or undesirable, for example very long delay applications such as communicating with probes that are deep in space. The use of degree-2 nodes to lower the iterative decoding threshold is relevant to all communication scenarios in which either bandwidth or power efficiency are important. This is because lower thresholds imply greater range for a given transmitted power or higher signaling rate for the same range and power.

Computation of ensemble weight enumerators for protograph LDPC codes requires knowledge of the partial weight enumerator $A_{w_1, w_2, \ldots, w_m}$ for every check with degree m in the protograph. Any degree-m check node can be split into an equivalent subgraph with two check nodes of degree $m_1+1$ and $m_2+1$ connected by a degree-2 variable node, such that $m_1+m_2=m$.

Figure 1:
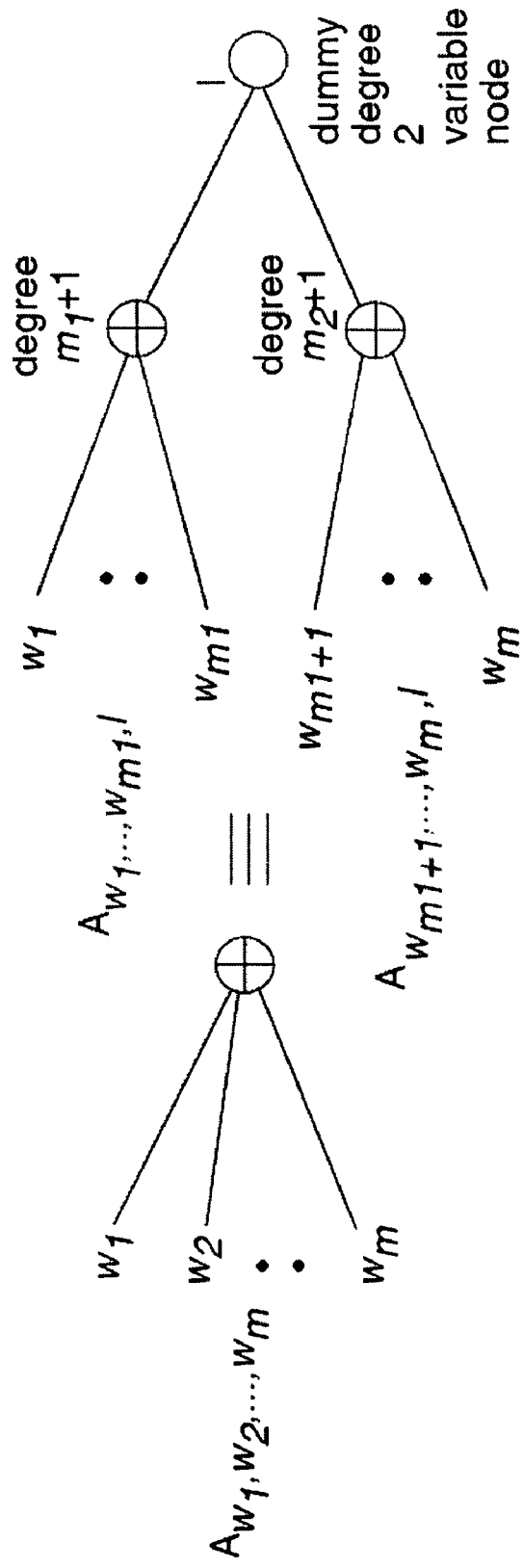
FIG. 1 shows a degree-m check and its equivalent representation for partial weight enumeration.

FIG. 1 shows a degree-m check and its equivalent representation for partial weight enumeration.

The partial weight enumerator for the check with degree m, expanded to represent m binary sequences each of length N, is obtained from the partial weight enumerators of the two checks with degrees $m_1+1$ and $m_2+1$ as $$A^c_{w_1, w_2 \ldots, w_m} = \sum_{l=1}^{N} \frac{A_{w_1, \ldots, w_{m_1}, l} A_{w_{m_1+1}, \ldots, w_m, l}}{\binom{N}{l}}$$

Applicants use this idea to construct protograph LDPC codes that include degree-2 variable nodes to achieve good iterative decoding thresholds, yet also have minimum distance growing linearly with block size.

The starting point can be a high-rate protograph LDPC code where the degrees of all variable nodes are at least 3. It is known that such a code ensemble has minimum distance that grows linearly with block size. An example of such a base protograph is the rate-⅘ protograph shown at the top of FIG. 2.

Next, a check node in the protograph is split into two checks and the total number of edges into the original check is distributed between the two new checks. After that, these two checks are connected with a non-transmitted degree-2 variable node. The resulting protograph has one additional check node and one new non-transmitted (i.e. not output, or punctured) degree-2 variable node. The corresponding protograph LDPC code ensemble will have the same average weight enumerator, and so its ensemble minimum distance will grow linearly with block size with the same linearity coefficient. The overall code rate remains the same. This operation of splitting one check node into two and connecting the resulting two check nodes with a degree-2 variable node can be applied again to subsequent protographs that result from previous applications of this operation.

Figure 2:
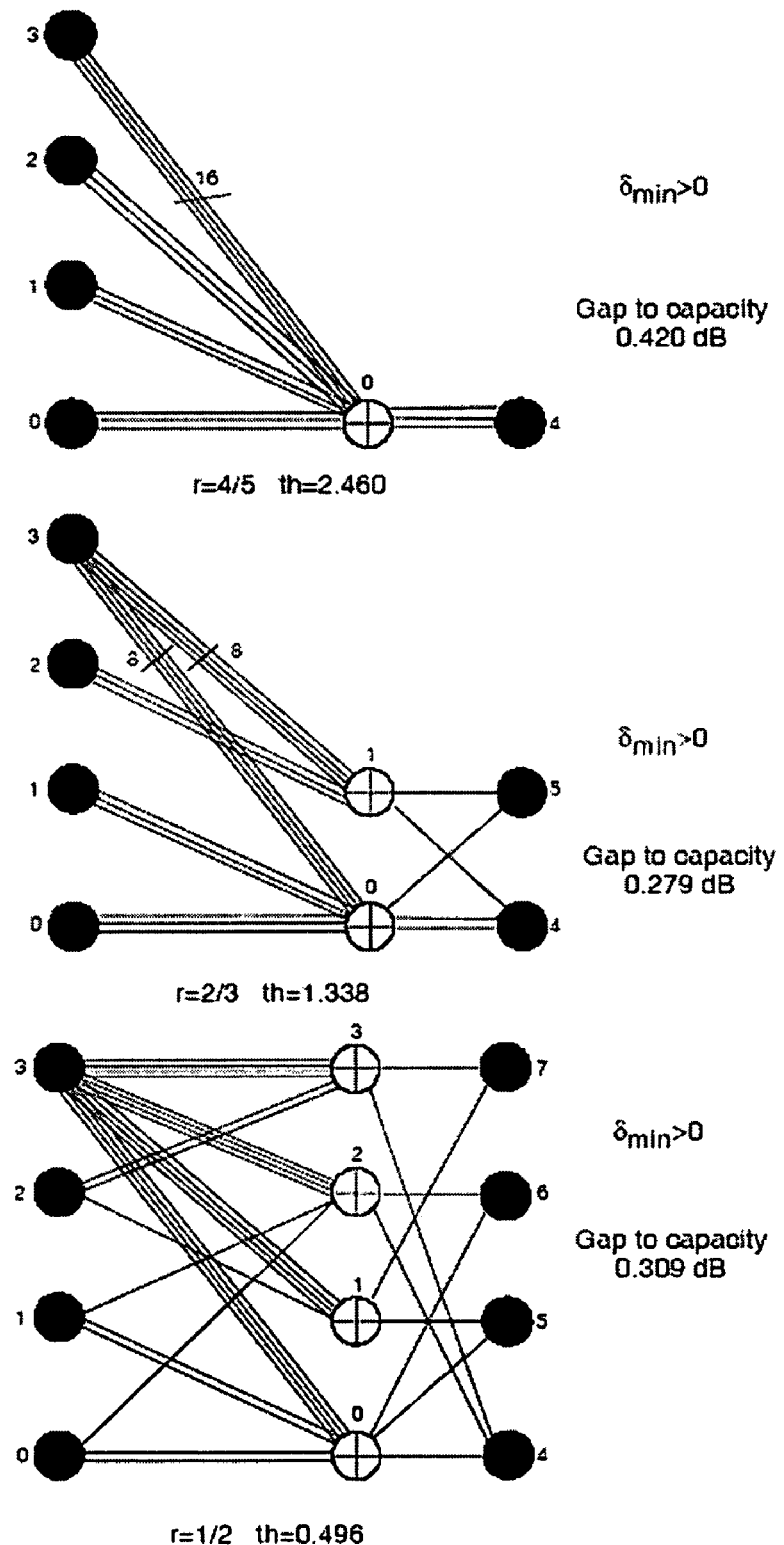
FIG. 2 shows an example of how to apply the method according to the present disclosure to construct rate-⅔ and rate-½ protographs starting from a rate-⅘ base protograph, for which a high-degree variable node was used in the base protograph.

Finally, if the new degree-2 variable node is changed from a non-transmitted node to a transmitted node, a lower-rate protograph is obtained, but the property that the ensemble minimum distance grows linearly with block size will be preserved. FIG. 2 illustrates the application of the procedure described above to obtain rate-⅔ and rate-½ protographs, starting from the rate-⅘ base protograph shown at the top of FIG. 2.

2. Rate Compatible Families of Identically Structured Protographs with Fixed Input Block Size all Having the Linear Minimum Distance Property.

Certain applications require rate compatible codes that have a fixed input block size. This implies that only the number of parity bits is allowed to vary. Examples are the CCSDS standard for Deep Space communications. Other examples include systems in which a higher layer produces packets with a fixed size. In such instances it may be desirable for the frame boundaries from the higher layer to coincide with frame boundaries from the coding layer.

To design such codes for these applications, applicants start with a high-rate protograph LDPC code with variable node degrees of at least 3, as in the procedure described with reference to FIG. 2. Lower rate codes are obtained by splitting check nodes and connecting them with degree-2 nodes. Applicants have proven that this guarantees that the linear minimum distance property is preserved for the lower-rate codes.

Continuing with the method described with reference to FIG. 2, at each operation comprising a splitting of one check node and connecting the two resulting nodes with degree-2 variable nodes, one has the option at each step to designate the status of the connecting degree-2 node to be either transmitting or non-transmitting. The rate of the protograph is lowered each time the connecting node is designated as a transmitted node, while the rate is unchanged each time the connecting node is designated as a non-transmitted node. Starting with a base protograph of highest rate and continuing this process for S steps, each step comprising a splitting of one check node into two and connecting the resulting two check nodes with either a degree-2 transmitted variable node or a degree-2 non-transmitted node, one obtains a rate-compatible family of protographs, all of which have identical graph structure including S additional variable nodes and S additional check nodes compared to the numbers of these nodes in the base protograph, the only difference among rates being the transmit status (transmitted or non-transmitted) of the S new degree-2 variable nodes.

By the process described in the paragraph above, protographs for all rates are obtained by applying the same number of splitting and connecting operations; the only rate-dependent difference is whether the connecting node is transmitted or not. The lowest-rate protograph is obtained when all of the degree-2 connecting nodes are transmitted, the highest-rate protograph is obtained when all of the degree-2 connecting nodes are non-transmitted, and intermediate-rate protographs are obtained when some of the degree-2 connecting nodes are of each type. The resulting protographs are identical in structure for all rates, except for the transmit status (transmitted or non-transmitted) of the degree-2 connecting nodes.

Figure 3:
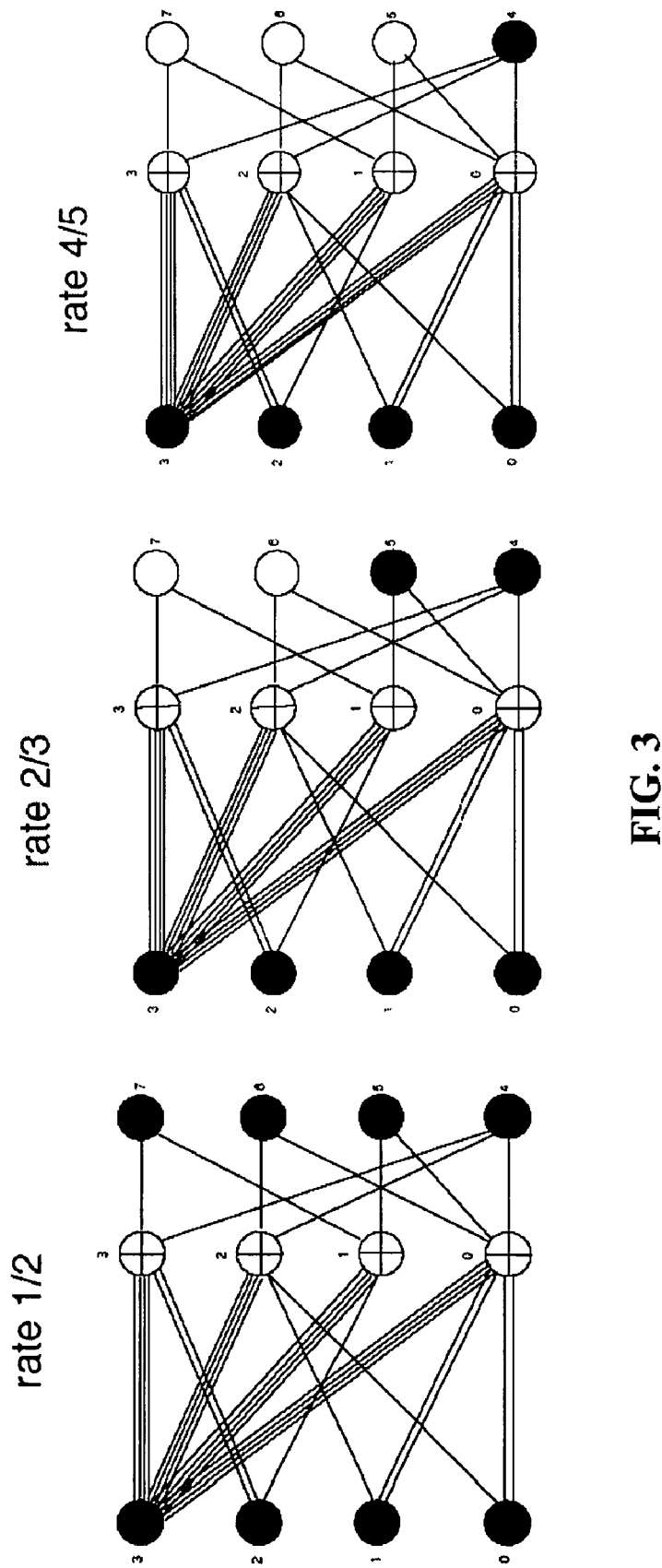
FIG. 3 shows a rate-compatible family of identically structured protographs generated from the same base protograph and for the same rates shown in FIG. 2, by applying the method according to the present disclosure.

The three protographs shown in FIG. 3 are equivalent to those shown in FIG. 2 but are obtained from the rate-⅘ base protograph by the process described in two paragraphs above. The result is a set of protographs in FIG. 3 that are identical in structure for all three rates, with the only difference being the transmit status of the three degree-2 connecting nodes. The rate-½ protograph is obtained when all three of these nodes are transmitted, the rate-⅘ protograph results when none of these three nodes in transmitted, and the rate-⅔ code is obtained when one of these three nodes is transmitted.

Reversing the construction process, it can be noted that the higher-rate protographs in FIG. 3 can be obtained by simply puncturing some of the degree-2 nodes of the rate-½ protograph.

Note that the rate-½ protograph code in FIG. 2 or FIG. 3 has ensemble asymptotic minimum distance δmin=0.005. The resulting codes for rates ½, ⅔, and ⅘ have a fixed input block size.

Figure 4:
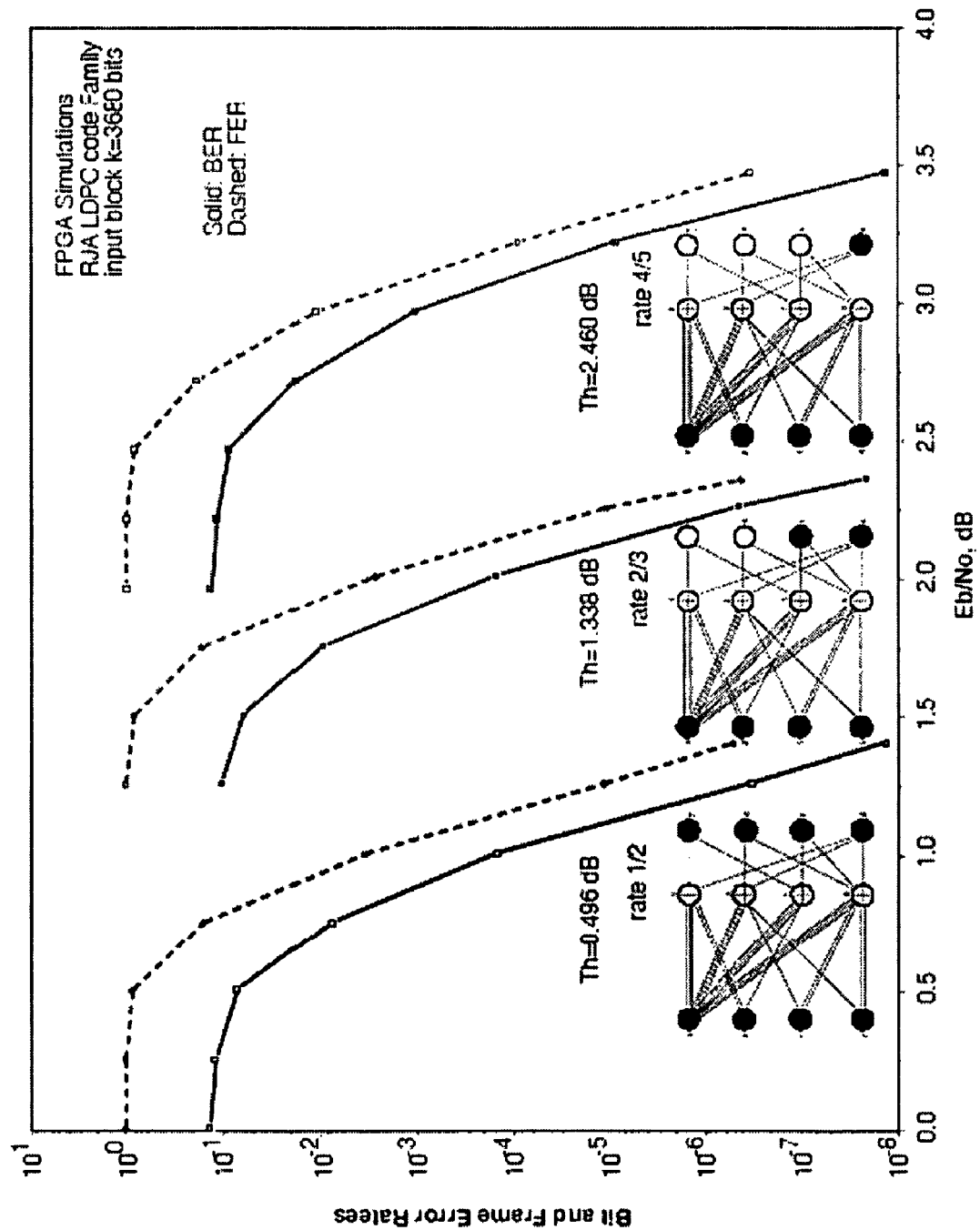
FIG. 4 shows simulation results for LDPC codes with input block size k=3680 expanded from the rate-½ through rate-⅘ protographs in FIG. 3.

FIG. 4 shows simulation results for LDPC codes with input block size k=3680 expanded from the rate-½ through rate-⅘ protographs in FIG. 3, for which a high-degree node was used in the base protograph.

3. Rate Compatible Families of Identically Structured Protographs with Fixed Output Block Size all Having the Linear Minimum Distance Property.

Fixed output block length codes are desirable in scenarios where a framing constraint is imposed on the physical layer. Perhaps the most common example is provides by links that employ orthogonal frequency division multiplexing (OFDM) as the modulation. Digital subscribed line modems use such a modulation as does the WiMax standard.

In the present disclosure, applicants construct rate-compatible protograph-based LDPC codes for fixed block lengths that simultaneously achieve low iterative decoding thresholds and linear minimum distance ($\delta_{min}>0$) such that error floors may be suppressed. These codes in accordance with the present disclosure are constructed starting from a low-rate base protograph that has degree-3 nodes and one high-degree node (which serves to lower the iterative decoding threshold). To construct a rate-compatible protograph family with fixed output block length, one can combine check nodes of the low-rate protograph to form higher-rate protographs. In the present disclosure, applicants use degree-2 non-transmitted nodes to implement check node combining (thereby achieving rate compatibility), but use no transmitted degree-2 nodes. The condition where all constraints are combined corresponds to the highest-rate code.

By avoiding transmitted degree-2 nodes applicants obtain a family of protographs all of which are guaranteed to have the linear minimum distance property. Limiting the protograph design to the use of degree-3 and higher variable nodes is a sufficient but not necessary condition to preserve the linear minimum distance property. For example, a protograph construction that uses transmitted degree-2 nodes and still achieves linear minimum distance is described previously with reference to FIG. 2.

The present disclosure describes small protograph-based codes that achieve competitively low thresholds without the use of degree-2 variable nodes and without degree-1 precoding in conjunction with the puncturing of a high degree node. The iterative decoding threshold for proposed rate-½ codes are lower, by about 0.2 dB, than the best known irregular LDPC codes with degree at least three. Iterative decoding thresholds as low as 0.544 dB can be achieved for small rate-½ protographs with variable node degrees at least three.

Higher-rate codes are obtained by connecting check nodes with degree-2 non-transmitted nodes. This is equivalent to constraint combining in the protograph. The condition where all constraints are combined corresponds to the highest-rate code.

Figure 5:
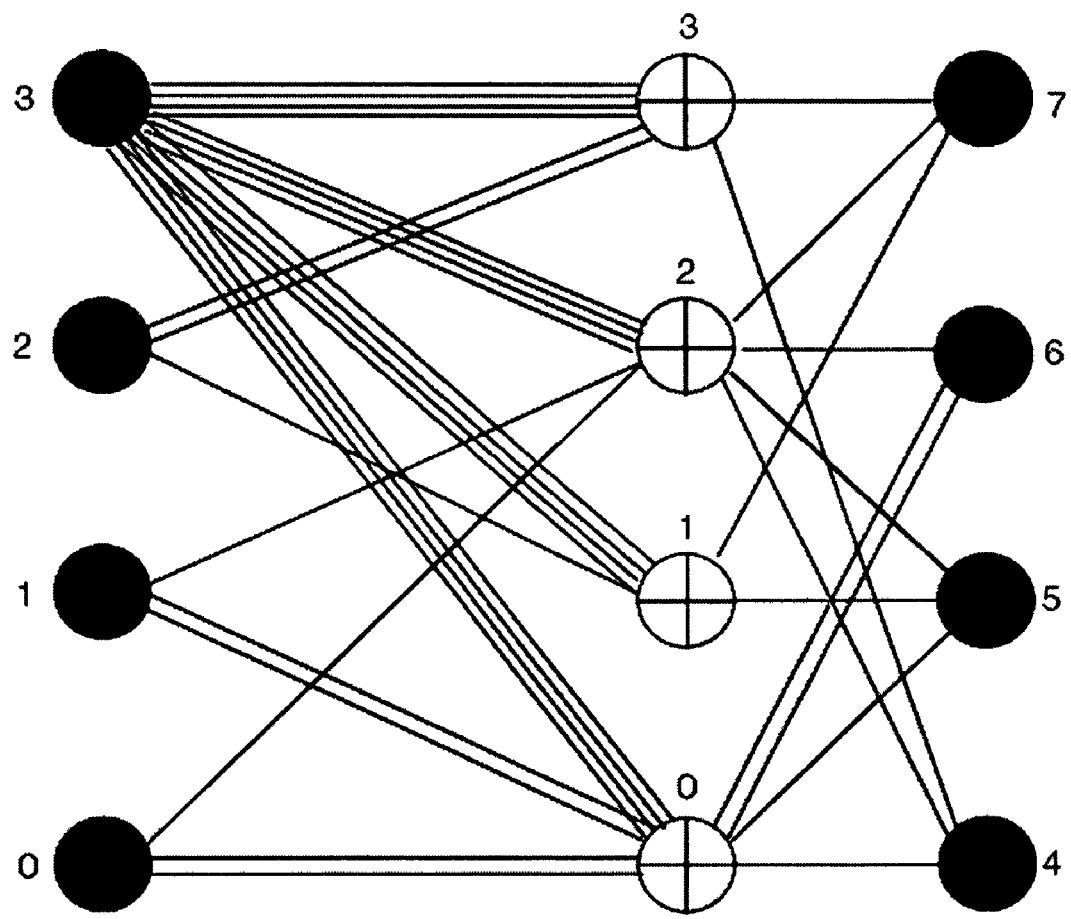
FIG. 5 shows a rate-½ protograph with 7 variable nodes of degree 3 and one variable node of high degree 16, used to lower the iterative decoding threshold.
Figure 6:
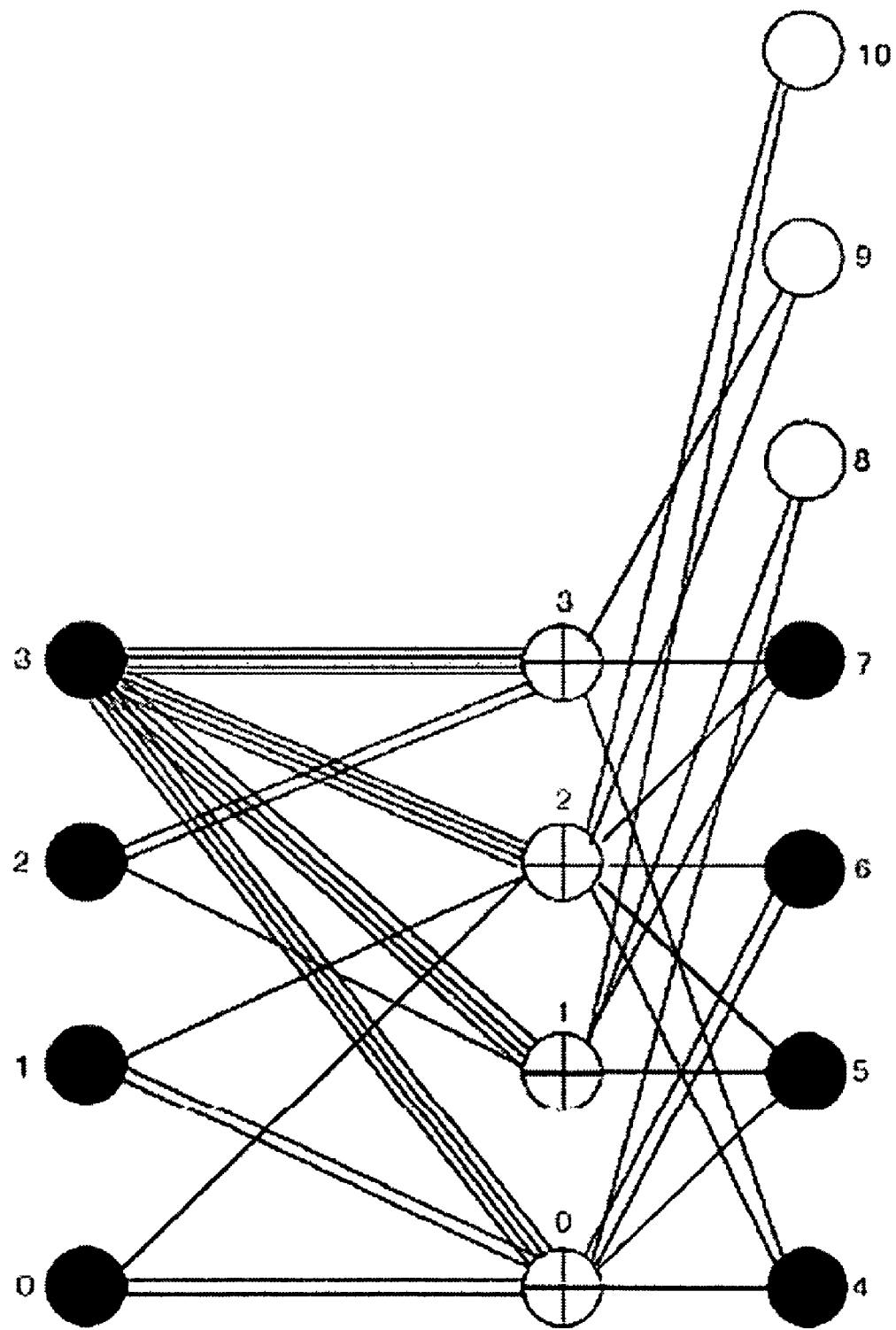
FIG. 6 shows construction of a rate-⅞ protograph starting from the rate-½ base protograph shown in FIG. 5, by applying the method according to the present disclosure.

The 8-node rate-½ protograph in FIG. 5 can be used as a base protograph to illustrate this construction. FIG. 6 shows the construction of a rate-⅞ protograph starting with the rate-½ base protograph in FIG. 5.

The single protograph structure in FIG. 6 can be used for rates ½, ⅝, ¾, and ⅞ if the nodes 8, 9, and 10 are properly set to "0" bit (equivalent to not having degree-2 node connections), or "X" where "X" represents no bit assignment to the node (a non-transmitted node). The table in FIG. 7 describes this operation. At the decoder the corresponding nodes to "0" bits are assigned highly reliable values, and to nodes "X" zero reliability values. Iterative decoding thresholds computed for the rate ½, ⅝, ¾, and ⅞ protographs are 0.618 (gap to capacity 0.43 db), 1.296 (gap to capacity 0.48 dB), 1.928 (gap to capacity 0.30 dB), and 3.052 dB (gap to capacity 0.21 dB) respectively.

Figure 8:
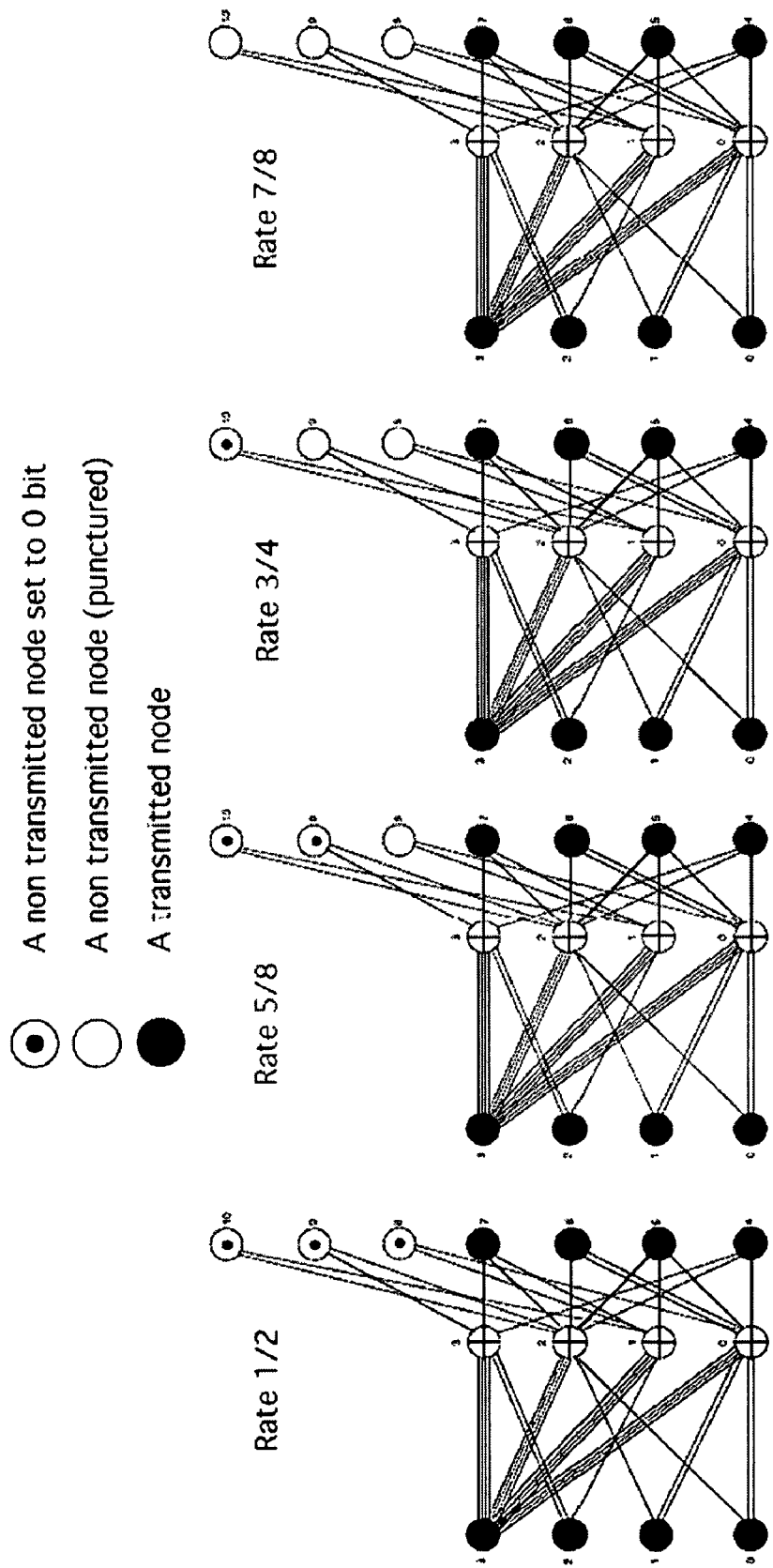
FIG. 8 shows a rate-compatible family of identically structured protographs of rates ½, ⅝, ¾, and ⅞, generated from the single protograph structure in FIG. 6 according to the prescriptions in the table in FIG. 7.

The rate-compatible family of protographs described by the master protograph in FIG. 6 together with the table in FIG. 7 is illustrated explicitly in FIG. 8. This family of protographs is described equivalently as follows. With each operation comprising a connecting of two check nodes with degree-2 non-transmitted variable nodes, one has the option at each step to designate the status of the connecting degree-2 node to be either set to zero or not. The rate of the protograph is unchanged each time the connecting node is set to zero, while the rate is increased each time the connecting node is not set to zero. Starting with a base protograph of lowest rate and continuing this process for S steps, each step comprising a connecting of two check nodes with a non-transmitted degree-2 variable node either set to zero or not, one obtains a rate-compatible family of protographs, all of which have identical graph structure including S additional variable nodes and the same number of check nodes compared to the numbers of these nodes in the base protograph, the only difference among rates being the status (set to zero or not) of the S new non-transmitted degree-2 variable nodes.

By the process described in the paragraph above, protographs for all rates are obtained by applying the same number of connecting operations; the only rate-dependent difference is whether the non-transmitted connecting node is set to zero or not. The highest-rate protograph is obtained when none of the degree-2 connecting nodes are set to zero, the lowest-rate protograph is obtained when all of the degree-2 connecting nodes are set to zero, and intermediate-rate protographs are obtained when some of the degree-2 connecting nodes are of each type. The resulting protographs are identical in structure for all rates, except for the status (set to zero or not) of the non-transmitted degree-2 connecting nodes.

Figure 9:
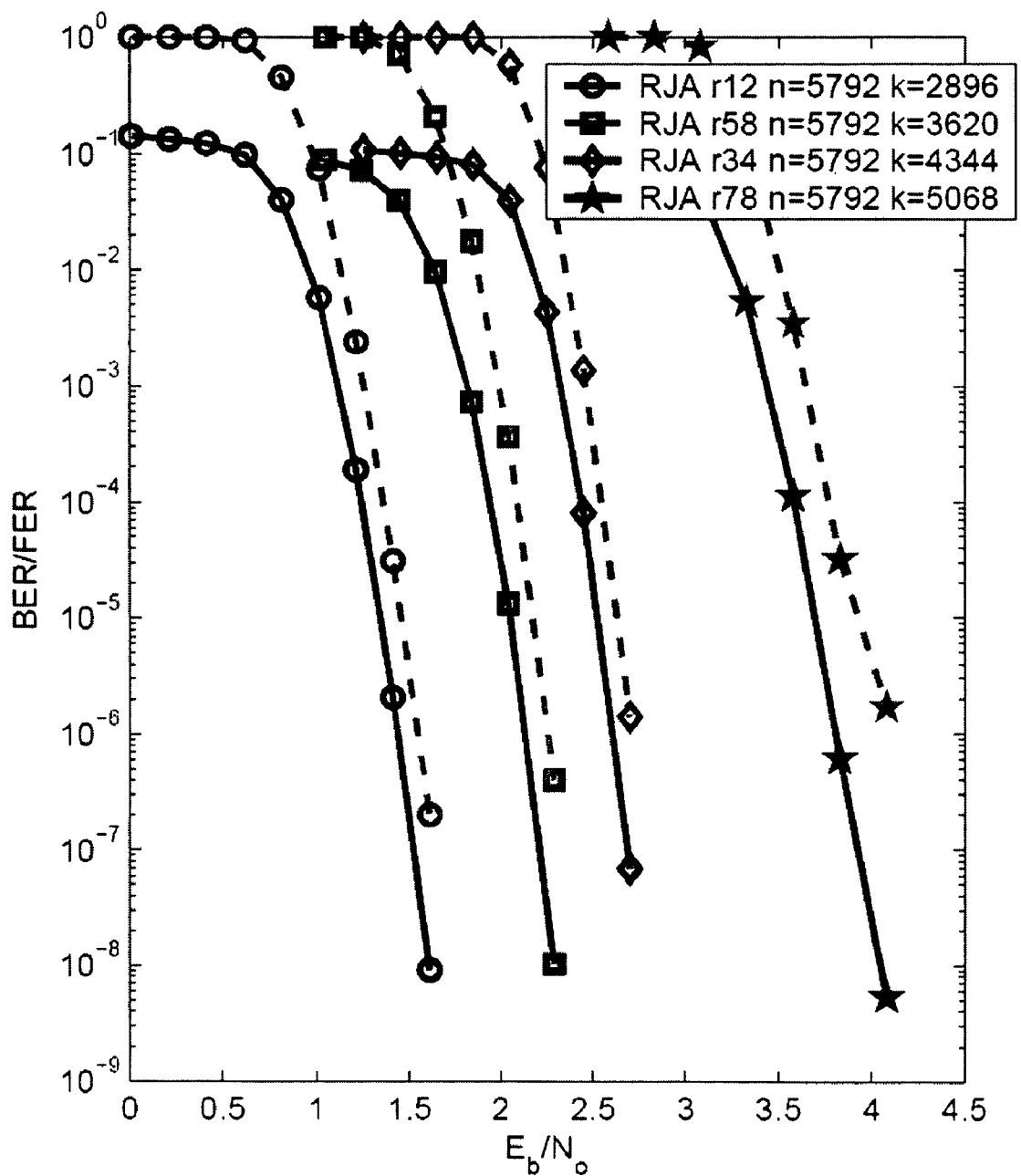
FIG. 9 shows the performance of LDPC codes with output block size n=5792 expanded from the rate-½ through rate-⅞ protographs in FIG. 8.

FIG. 9 shows bit (solid curves) and frame (dashed curves) error rate results for LDPC codes with output block length n=5792 codes expanded from the rate-compatible protograph family of FIG. 8. The three lowest rates exhibit no error flooring at frame error rates of 3e-7 and higher. However the rate-⅞ code does display error events near the 1e-6 level due to certain graph anomalies. Note that the choices of circulant permutations used to construct the codes of rates ½, ⅝, and ¾ were the same as those used for the rate-⅞ code, with the exception of removal of circulants (and corresponding edges) associated with those nodes (8, 9, and/or 10) that are set to zero in FIG. 8. For an efficient common decoder implementation, instead of being removed, these nodes could be assigned highly reliable values corresponding to "0" bits to cancel any contributions to their respective check nodes.

4. Protographs Having the Linear Minimum Distance Property and Low Iterative Decoding Threshold.

In applications where latency is not an issue long block length codes can be used to maximize power and or bandwidth efficiency. Protograph code thresholds can be minimized even further for these uses through the addition of preceding structures. Direct Broadcast Satellite and Deep Space applications would benefit from this technique.

Figure 10:
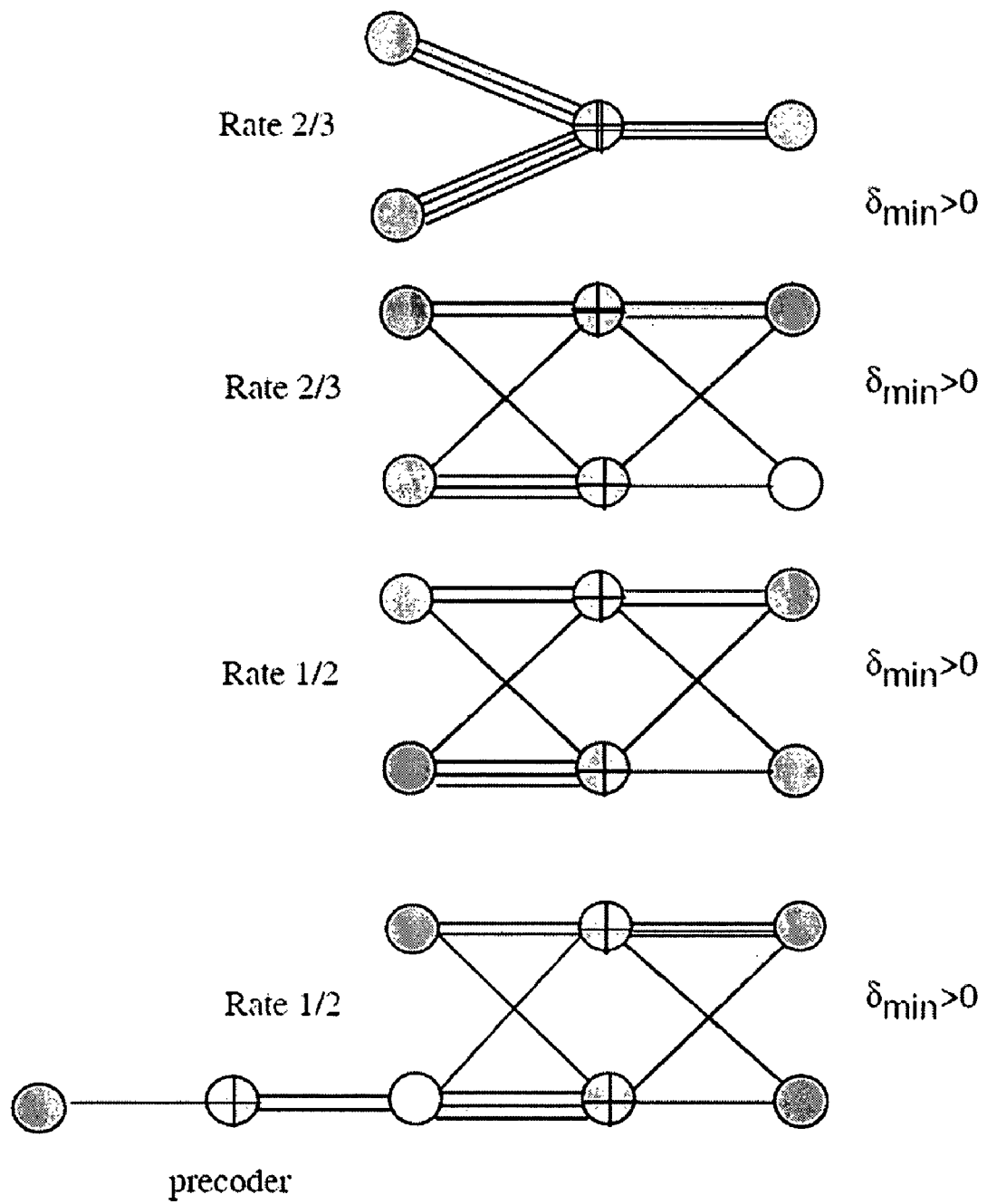
FIG. 10 shows how to apply the method according to the present disclosure, starting from a base protograph with all variable node degrees 3 or higher, and including precoding to lower the iterative decoding threshold, to obtain a rate-½ AR4JA protograph.

FIG. 10 shows an example of the construction described with reference to FIG. 2, as applied to obtain a rate-½ AR4JA protograph, starting with a rate-⅔ base protograph having all variable node degrees 3 or higher. In the last step of this example, applicants also attached an accumulator as a precoder to lower the iterative decoding threshold. The iterative decoding threshold for this rate-½ code is 0.64 dB, and the asymptotic growth rate of the ensemble minimum distance is $\delta_{min}$=0.015.

After using the check node splitting technique described with reference to FIG. 2 to design a particular low-rate code such as the rate-½ AR4JA code in FIG. 10 with minimum distance guaranteed to grow linearly with block size, this property will be preserved if additional variable nodes of degree-3 and higher are attached to this low-rate protograph.

Thus, it can be concluded that the entire AR4JA family described in U.S. Pat. No. 7,343,539, incorporated herein by reference in its entirety, for rates r=(n+1)/(n+2), n=0, 1, 2, . . . has ensemble minimum distance growing linearly with block size.

Figure 11:
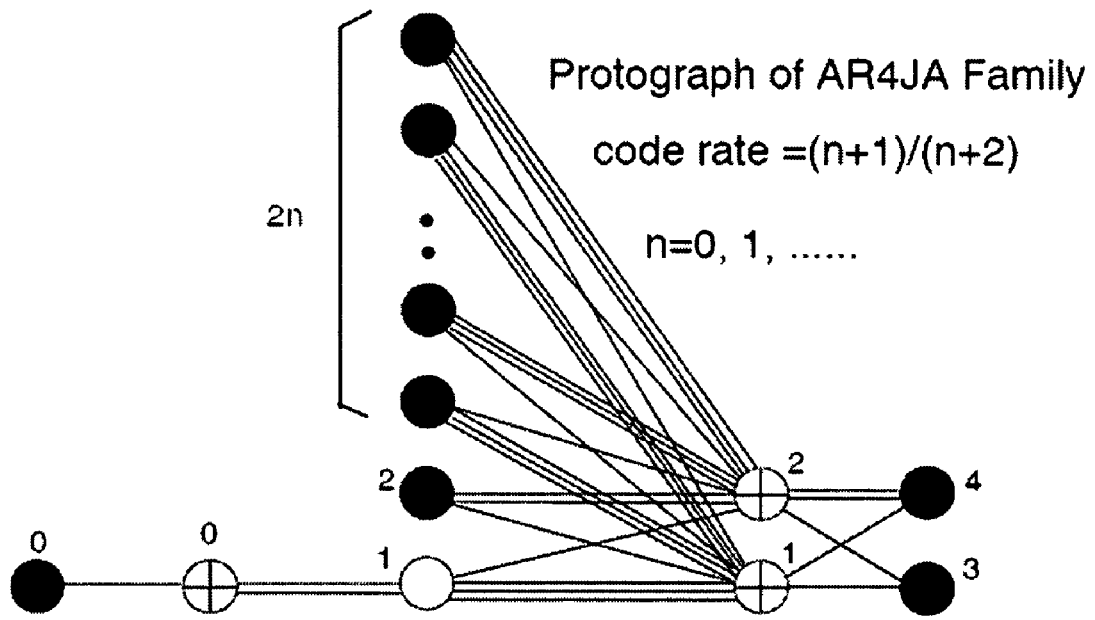
FIG. 11 shows protographs for a family of AR4JA protographs of rates ½ through ⅞, together with the iterative decoding thresholds (in dB) achieved by this family compared to the corresponding capacity limits (in dB).
Figure 12:
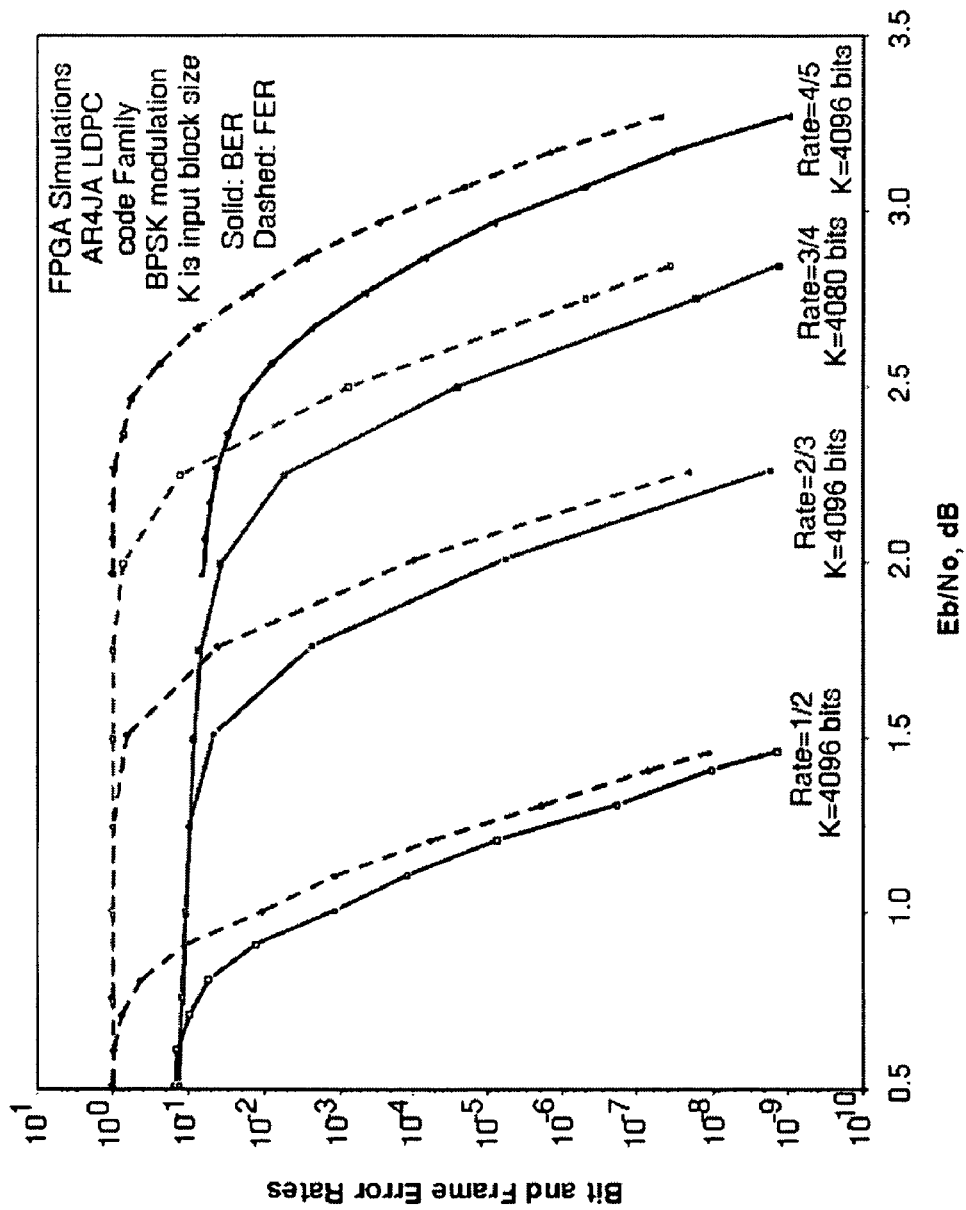
FIG. 12 shows bit and frame error rate simulation results for LDPC codes with input block size k=4096 expanded from the rate-½ through rate-⅘ AR4JA protographs in FIG. 11.

Protographs for this AR4JA family are shown in FIG. 11. The thresholds achieved by this family compared to the corresponding capacity limits are also shown in FIG. 11. FIG. 12 shows bit and frame error rate simulation results for LDPC codes with input block size k=4096 expanded from the rate-½ through rate-⅘ AR4JA protographs in FIG. 11, for which precoding was used to lower the decoding threshold.

The example in FIG. 2 illustrates that preceding is not essential for constructing a code having both a low iterative decoding threshold and linearly growing minimum distance. Instead, a high-degree variable node can be used to lower the iterative decoding threshold. In FIG. 2 applicants start with a rate-⅘ code having variable node degrees 3 except for one variable node of high degree 16. Then the rate-⅔ and rate-½ protographs in FIG. 2 are obtained via the check node splitting process described with reference to such figure.

Figure 13:
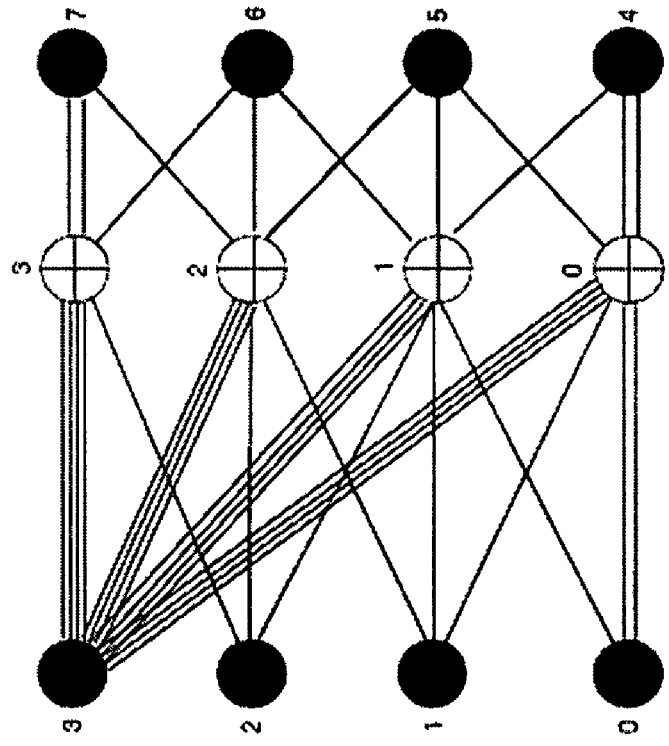
FIG. 13(a) shows an 8-node rate-½ protograph with all variable node degrees 3.
FIG. 13(b) shows the same protograph of FIG. 13(a), except with one variable node degree increased to 16 to lower the iterative decoding threshold.
Figure 13:
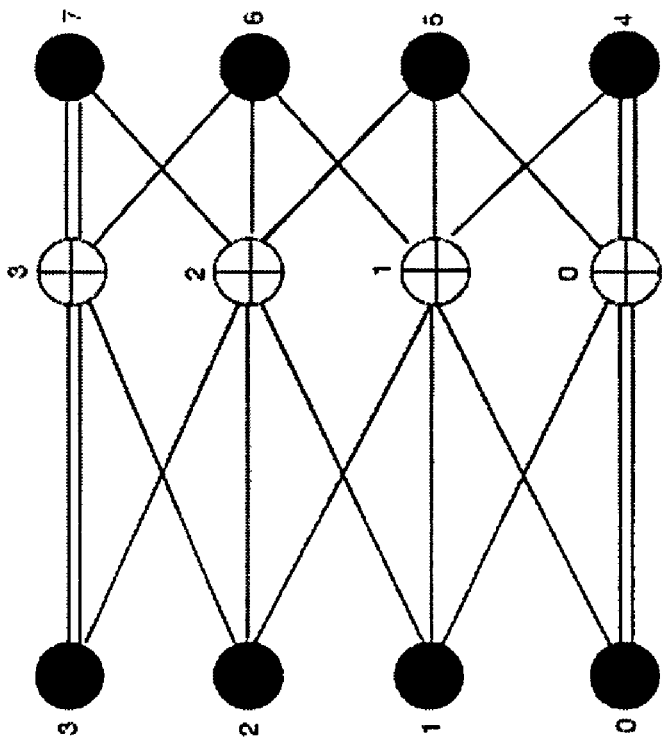

It can be shown that it is in fact possible to design protograph-based rate-½ LDPC codes with degrees at least 3 and maximum degree not more than 20, with iterative decoding threshold less than 0.72 dB. One can start with a rate-½, eight-node protograph with variable node degrees 3 as shown in FIG. 13(a). The iterative decoding threshold for this code is 1.102 dB. One of the nodes is then changed to degree 16 as shown in FIG. 13(b). The iterative decoding threshold for this code is 0.972 dB. Note that very little improvement is obtained by using one high-degree node.

Figure 14:
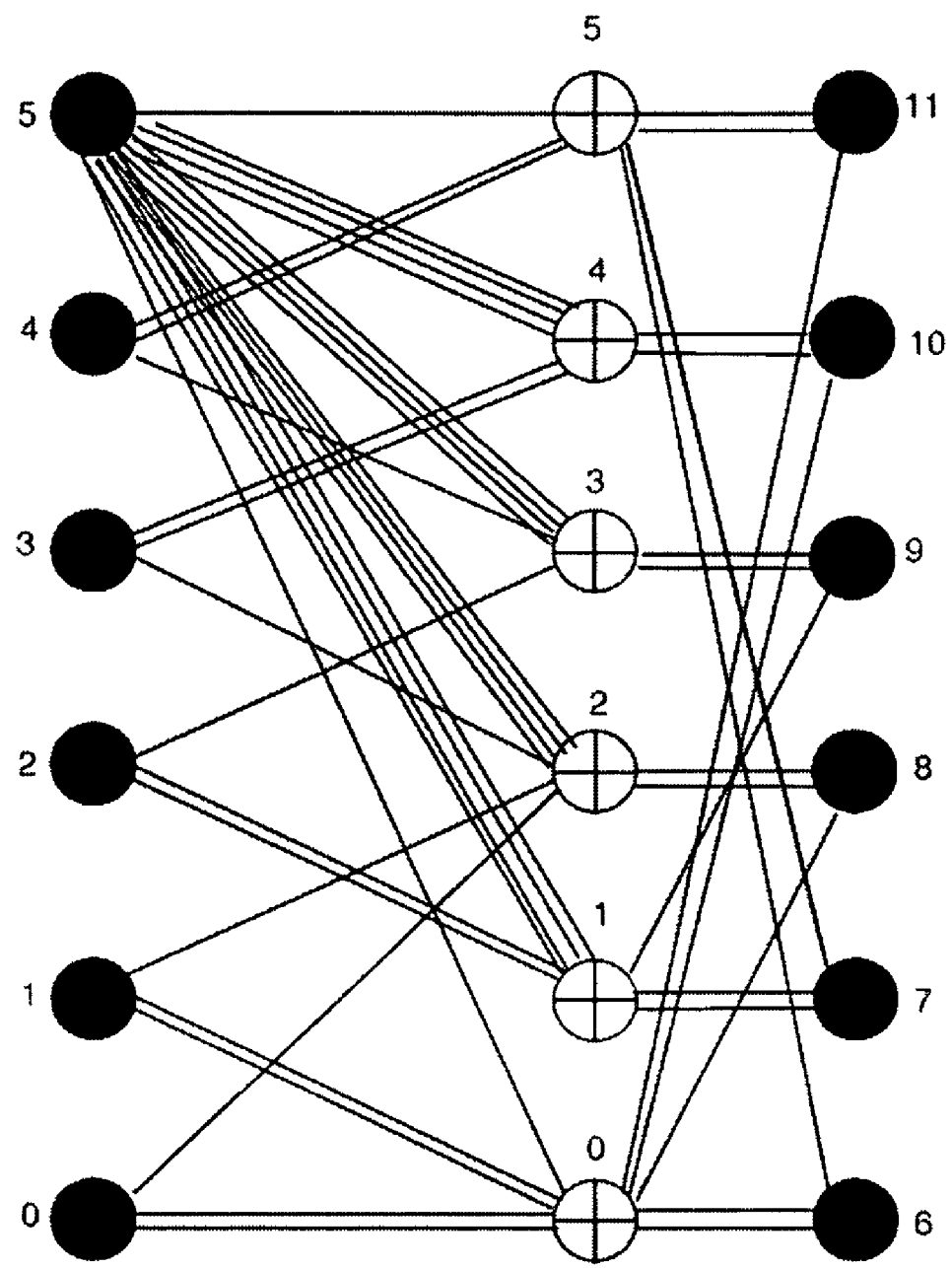
FIG. 14 shows a protograph with 11 variable nodes of degree 3, and one variable node of degree 18.

Now the connections from variable nodes to check nodes can also be changed asymmetrically. After a few hand-selected searches the protograph previously shown in FIG. 5 is obtained, which has threshold 0.618 dB. Note that it is possible to obtain an even lower threshold (0.544 dB) if the number of nodes in the protograph is increased to 12 and highest node degree is set to 18 as shown in FIG. 14.

A real-time field programmable gate array (FPGA) decoder has been used to implement and test all of the protograph coding approaches described in the present disclosure. The system, which is a universal decoder for sparse graph codes, operates using an in system programmable Xilinx Virtexll-8000 series FPGA. Throughput on the order of 20 Mbps is achieved and performance plots of frame or bit error rate versus signal to noise can be computed using an integrated all white gaussian noise generator.

Accordingly, what has been shown among the four categories of codes constructed in accordance with the methods described in the present disclosure are individual protograph-based LDPC codes with linear minimum distance and rate-compatible families of protograph-based LDPC codes with linear minimum distance. While these individual protograph-based LDPC codes and rate-compatible protograph-based LDPC code families have been described by means of specific embodiments and applications thereof, it is understood that numerous modifications and variations could be made thereto by those skilled in the art without departing from the spirit and scope of the disclosure. It is therefore to be understood that within the scope of the claims, the disclosure may be practiced otherwise than as specifically described herein.

The invention claimed is:

1. A digital communication coding method, comprising:
   applying one or more operations in succession starting with a base protograph having all variable node degrees at least 3, each said one or more operations comprising:
   a splitting of one check node of the base protograph or subsequent protographs into two check nodes; and
   connecting said two check nodes with a transmitted degree-2 variable node,
   thus obtaining a protograph representing a low-density parity-check (LDPC) code adapted to be decoded by a decoder, the protograph being provided with a linear minimum distance property and comprising at least one variable node with degree less than 3.

2. A digital communication coding method, comprising:
   applying one or more operations in succession starting with a base protograph having all variable node degrees at least 3, each said one or more operations comprising:
   a splitting of one check node of the base protograph or subsequent protographs into two check nodes; and
   connecting said two check nodes with either a transmitted degree-2 variable node or a non-transmitted degree-2 variable node,
   thus obtaining a family of low-density parity-check (LDPC) codes of different rates but constant input block size, said family represented by a set of protographs of different rates adapted to be decoded by a decoder, said protographs being provided with a linear minimum distance property.

3. A digital communication coding method, comprising:
   applying one or more operations in succession starting with a base protograph having all variable node degrees at least 3, each said one or more operations comprising:
   connecting two check nodes of the base protograph or subsequent protographs with either a non-transmitted degree-2 variable node or a non-transmitted degree-2 variable node set to zero,
   thus obtaining a family of low-density parity-check (LDPC) codes of different rates but constant output block size, said family represented by a set of protographs of different rates adapted to be decoded by a decoder, said protographs being provided with a linear minimum distance property.

4. The digital communication coding method of claim 1, further comprising precoding one or more bits of the LDPC code.

5. The digital communication coding method of claim 2, further comprising precoding one or more bits of each LDPC code of the family of LDPC codes.

6. The digital communication coding method of claim 3, further comprising precoding one or more bits of each LDPC code of the family of LDPC codes.

* * * * *